United States Patent [19]

Paradise et al.

[11] Patent Number: 4,489,422

[45] Date of Patent: Dec. 18, 1984

[54] FREEZE CLOCK CIRCUIT

[75] Inventors: Joseph P. Paradise, Somerville; Donald J. Derkach, Flemington, both of N.J.

[73] Assignee: RCA Corporation, New York, N.Y.

[21] Appl. No.: 332,831

[22] Filed: Dec. 21, 1981

[51] Int. Cl.³ .............................................. G06M 3/12
[52] U.S. Cl. ....................................... 377/28; 377/44; 377/55
[58] Field of Search ..................... 377/28, 56, 30, 44, 377/46, 55, 54; 371/62; 364/571

[56] References Cited

U.S. PATENT DOCUMENTS 3,716,703  2/1973  Gordon ................................. 377/50

Primary Examiner—Marc E. Bookbinder
Assistant Examiner—Timothy K. Greer
Attorney, Agent, or Firm—Joseph S. Tripoli; George E. Haas; Henry I. Schanzer

[57] ABSTRACT

A circuit for controlling the application of a timing pulse to a count down chain where the contents of the count down chain are read-out in stages and asynchronously with respect to the application of the timing pulse. The control circuit ensures that a timing pulse is not applied during the read-out of the contents of the count down chain.

8 Claims, 7 Drawing Figures

FREEZE CLOCK CIRCUIT

This invention relates to a timing system and, in particular, to one including a counting chain whose contents are read-out in stages.

In the accompanying drawing like reference characters denote like components, and FIG. 1 is a block diagram of a prior art timing system;

Many counting and timing systems include a counting chain coupled to a microprocessor or other utilization and display device with the counting chain having more data outputs (e.g. 40) than the number of input lines (e.g. 8) to the microprocessor or utilization device. For example, where a counting chain is connected to an 8 bit microprocessor, only 8 outputs of the counting chain can be read-out onto the microprocessor at a time. If the counting chain has, for example, 40 outputs they must be read-out in groups (or sections) of eight (or less) which are multiplexed onto the 8 bit lines of the microprocessor. Reading the contents of the counting chain in sections and asynchronously with respect to the input pulses applied to the counting chain gives rise to a significant problem of erroneous read-outs best explained by reference to FIGS. 1 and 2.

Figure 1:
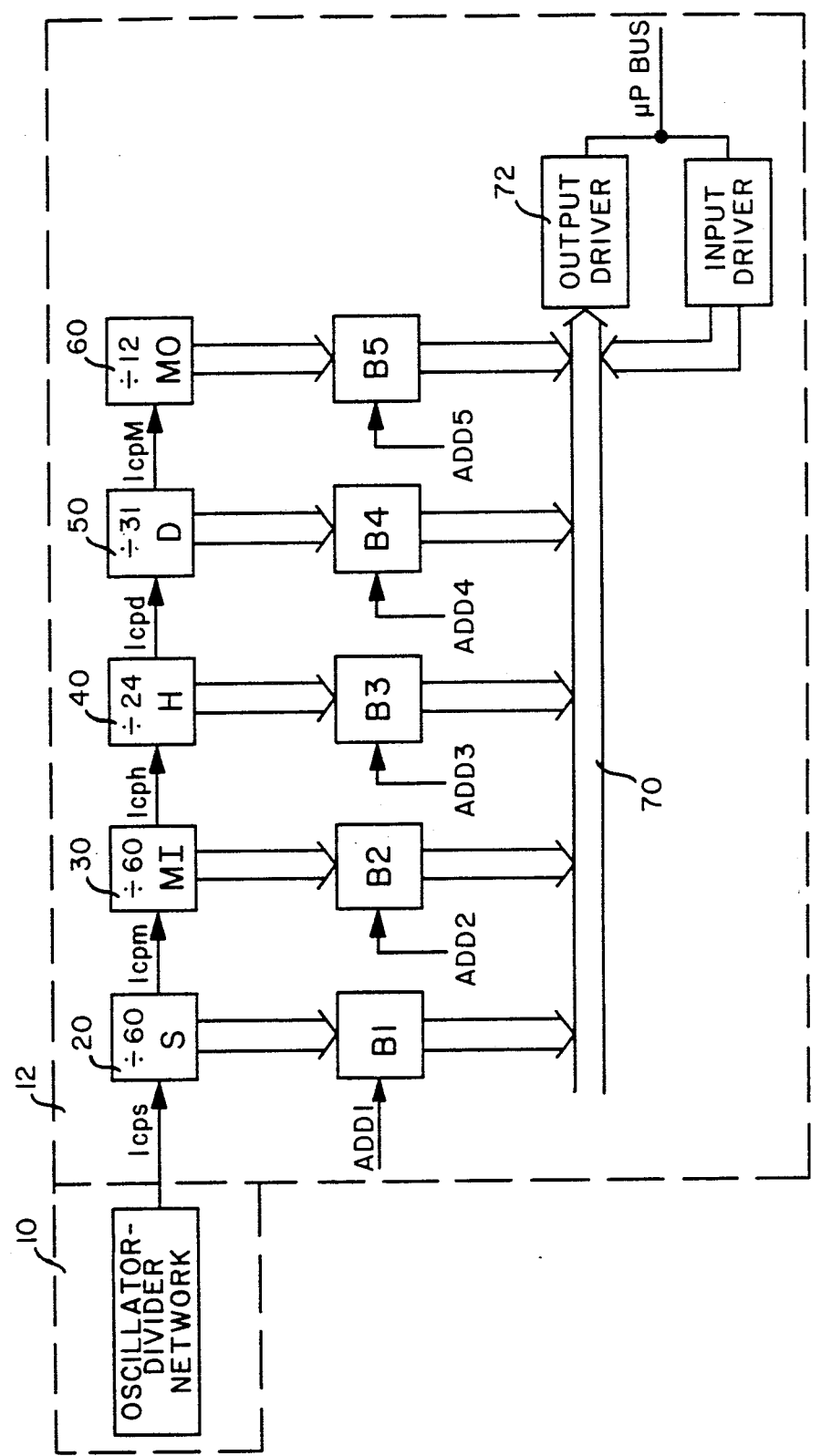

FIG. 1 shows a known real time clock system comprised of an oscillator and divider network 10 coupled to still another divider network 12 comprised of counters 20, 30, 40, 50 and 60 forming a count down chain and circuitry for selectively reading out the contents of the counters. The 1 cycle-per-second (cps) output of oscillator network 10 is applied to the input of a divide-by-60 "seconds" (S) counter 20. The 1 cycle per minute (cpm) output of the S counter is applied to the input of a divide-by-60 "minutes" (MI) counter 30. The 1 cycle per hour (cph) output of the MI counter is applied to the input of a divide-by-24 "hours" (H) counter and the 1 cycle per day (cpd) output of the "H" counter is connected to the input of a divide-by-31 "days" (D) counter 50 whose 1 cycle per month (cpM) output is applied to the input of a divide-by-twelve "months" (MO) counter 60.

In the brief description of the operation of the counting chain to follow assume that each counter is advanced by one count when its input signal makes a negative going transition (i.e. goes from "high" to "low".) The "S" counter, responsive to the 1 cps signal, counts to 59. On the next (i.e. 60th) cps input pulse the "S" counter is reset to zero and concurrently produces a one-cycle-per-minute (cpm) carry or overflow pulse which is applied to the MI counter which causes the latter to advance by one count. The MI counter also counts up to 59. On the next (e.g. 60th) cpm input pulse the MI counter is reset to zero and concurrently produces a one cycle-per-hour (cph) "carry" pulse applied to the "H" counter. The "H" counter counts to 23. On the 24th cph input pulse, the H counter is reset to zero and concurrently produces a one cycle-per-day (cpd) carry pulse applied to the "D" counter. On the 32nd cpd input pulse the "D" counter (assumed for purpose of illustration to be programmed to count to 31) is reset to one and produces a one-cycle per month (cpM) carry pulse which is applied to the "MO" counter.

The contents of each counter may be read-out in a given sequence (e.g. in ascending order, the S counter, then the MI, H, D and MO counters) via respective output buffers (B1, B2, B3, B4 and B5) controlled by respective Address (ADD) signals (ADD 1 through ADD 5). The output of each buffer is then multiplexed onto an output BUS 70 which is coupled via an output driver 72 to a microprocessor (not shown) or other data handling or display device (not shown).

An erroneous read-out occurs if an input pulse is applied to the counting chain during a read-out period. That is, the microprocessor or other display device will store or display erroneous information if after some of the counter sections are read-out a new input pulse is applied to the system which causes a carry pulse to be propagated to the remaining, still unread, counter sections, as discussed below.

Assume that initially the S, MI, H, D, and MO counters are respectively storing 59 seconds, 59 minutes, 23 hours, 31 days and 8 months.

Figure 2A:
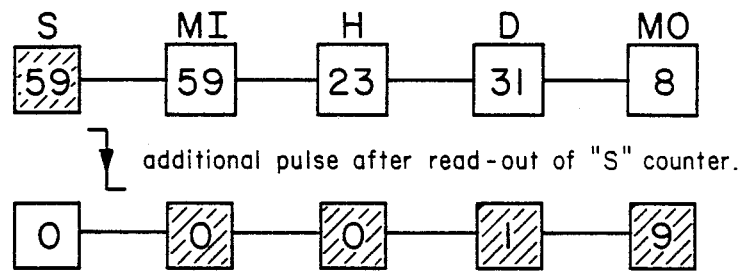
FIGS. 2A to 2D are a diagram of a timing sequence illustrating a problem associated with the system of FIG. 1.

(a) Assume now that the data (i.e. 59 seconds) in counter "S" is read-out and stored in the microprocessor and that the next cps clock input (when the 1 cps signal goes from "high" to "low") is applied to the counting chain before the minutes counter is read. Shortly after the cps pulse is applied (to account for ripple propagation delays) the counter stages are advanced to 0 seconds, 0 minutes, 0 hours, 1 day, and 9 months. However, the total count read-out to, and stored by, the microprocessor will be 59 seconds, 0 minutes, 0 hours, 1 day and 9 months. Consequently, the read-out will be in error by almost 59 seconds, as shown in FIG. 2A.

Figure 2B:
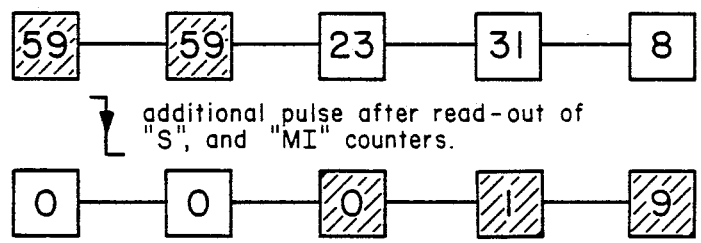

(b) Assume now that the 59 seconds and 59 minutes in the S and MI counters are sequentially read-out onto the microprocessor bus and that a cps clock input pulse is then applied advancing the contents of the counter stages to 0 seconds, 0 minutes, 0 hours, 1 day and a month. The final information read by the microprocessor will then be 59 seconds, 59 minutes, 0 hour, 1 day and 9 months. Thus, an error of close to an hour results from the read-out as shown in FIG. 2B.

Figure 2C:
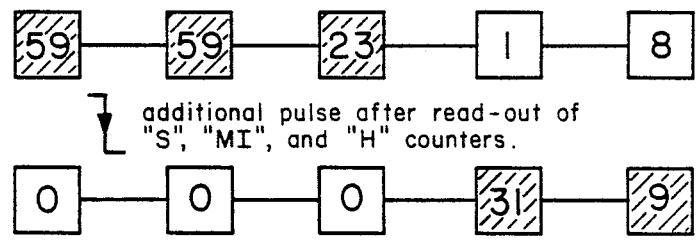

(c) Likewise, if the 59 seconds, 59 minutes, and 23 hours stored in the S, MI and H counters are sequentially read-out onto the microprocessor bus and a 1 cps clock input is then applied advancing the counter stages to 0 seconds, 0 minutes, 0 hours, 1 day and 9 months, an error of close to a day will result when the contents of the remaining stages are read-out as shown in FIG. 2C.

Figure 2D:
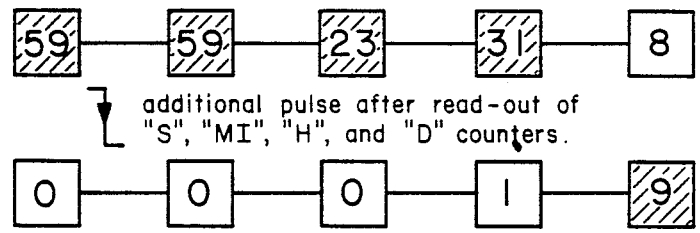

(d) Likewise, if the 59 seconds, 59 minutes, 23 hours, and 31 days stored in the S, MI, H and D counters are sequentially read-out to the microprocessor and a 1 cps clock input is then applied advancing the count in the counter stages to 0 seconds, 0 minutes, 0 hours, 1 day and 9 months, the total count stored by the microprocessor will be 59 seconds, 59 minutes, 23 hours, 31 days and 9 months. Thus, an error of close to a month results as shown in FIG. 2D.

In addition to the conditions discussed above errors can result due to propagation delays within and between counter sections. If a read-out occurs immediately after the application of an input clock signal some of the counter sections may be read-out while a carry (or overflow) pulse is rippling down the counter chain. Consequently, read-out errors, as discussed above, will occur where some of the counters sections are read-out prior to the rippling through of a count while others are read-out after the count has rippled through.

Thus, if an input clock transition occurs between read-out of sections of the counter chain, or just about the time that read-out of the counters is initiated, an erroneous read-out may occur. If the read operation were synchronized to the input clock, the problem would be removed. However, to have a flexible system it is required (or desirable) that the microprocessor (or other device) controlled read operation be asynchronous with respect to the input (1 cps) clock. Hence, since a finite time (e.g. microseconds) is required to read the contents of each of the five counter sections, a clock transition may occur during a read operation with the resultant problem discussed above.

In timing systems embodying the invention, the problem of the erroneous read-out of the contents of the counting chain is solved by:

(a) Sensing the occurrence of a counter read-out command within a predetermined time period (T1) prior to the occurrence of an input signal to the counter chain;

(b) delaying the application of the input signal to the counting chain for a given period of time (T2) which is sufficiently long to enable the read-out of the contents of the counting chain; and (c) automatically applying a "delayed" input signal to the first stage of the counting chain following the delay period T2.

The invention will now be explained with reference to FIG. 3 which includes an oscillator section 10a, a section 12a which like section 12 of FIG. 1 includes five counters connected in series, a section 80 comprised of circuitry to control the application of the counting signal generated by oscillator 10a to the first (S) counter in section 12a; and a microprocessor 100 which determines when the counters are to be read and which generates various addresses to determine the read-out sequence.

Section 10a includes an oscillator network which may be, for example, of the type disclosed in application note —ICAN 6086—titled "Timekeeping Advances Through COS/MOS Technology" by S. S. Eaton, or of the type disclosed in application note —ICAN 6166—titled "COS/MOS MSI Counter and Register Design and Applications" by R. Heuner et al., both ICANs published by RCA Corporation in RCA Solid State Data Book, copyright 1972. In general, the oscillator network may be any one of a number of known oscillator circuits capable for this illustrative design of producing at least the following outputs: (1) Complementary clock signals f1 and $\overline{f1}$ having a frequency of 2 cycles per second; and (2) Complementary clock signals f2 and $\overline{f2}$ having a frequency of 1 cycle per second. The clock signals as noted below are applied to various logic gates of the timing system to produce desired timing periods.

Section 12a, similarly to section 12 of FIG. 1, includes seconds (S), minutes (MI), hours (H), days (D) and months (MO) counters. Each counter may be, for example, similar to any of the CD4020 family of COS/MOS Ripple-Carry Binary Counter/Dividers manufactured by RCA Corporation. However, any other suitable counter may be used to form any of the sections of the count down chain. The counters may be interconnected to form a counting chain as shown, for example, in ICAN 6086 and 6166 or in an accordance with any other suitable interconnecting arrangement.

The microprocessor 100 is, by way of example, an 8 bit processor. The microprocessor includes counter store 102 for storing the outputs of the counter chain when these outputs are supplied 8 bits at a time. The processor also includes a function control 104 which selectively generates a read command and an address generator 106 which produces 6 addresses (Add 1 ... ADD 6, sometimes identified as $A_1 ... A_6$) following the generation of a read command. The microprocessor used to practice the invention is modified so as to be programmed to produce a "dummy" address ADD 6 prior to the generation of any of the other addresses (ADD 1 through ADD 5). ADD 6 is termed a dummy address because it does not cause the read-out of any of the counter sections. For example, following the generation of a read command by the microprocessor, address signals beginning with ADD 6 are generated at intervals of 3 microseconds. The addresses, other than ADD 6, when generated cause the read-out of their respective counter sections. That is ADD 1, 2, 3, 4 and 5 cause the read-out of the contents of the S, MI, H, D and MO counters, respectively.

Section 80 controls the application of the f2 clock signal to the "S" counter. Circuit 80 includes a six-input OR gate 81 to which are applied address signals A1 through A6. Each address signal is driven positive (representing a "1"), in turn, following a command to read-out the contents of the counters. The output E1 of OR gate 81 is applied to one input of a three-input AND gate 83. The other two inputs to AND gate 83 are the f1 and f2 clock signals. The output (E2) of AND gate 83 is applied to the SET input of the set-reset flip-flop 85. Flip-flop 85 is shown to be comprised of two cross-coupled NOR gates, but any suitable set-reset flip-flop could be used instead. The f1 and $\overline{f2}$ clock signals are applied to the inputs of a two-input AND gate 87 whose output E3 is applied to one input of two-input OR gate 86. The output of OR gate 86 is applied to the RESET input of flip-flop 85. The other input of OR gate 86 is the output E4 of three-input AND gate 88. The $\overline{f1}$ and $\overline{f2}$ clock signals and ADD 6 are applied to the three inputs of AND gate 88. Thus, a high (positive) output, representing a 1, from AND gate 87 or from AND gate 88 will reset flip-flop 85. The Q output of flip-flop 85 is applied to one input of a two-input OR gate 89. The other input of OR gate 89 is the f2 clock signal generated within oscillator network 10a. The output E5 of gate 89, also denoted as $CL_{IN}$, is applied to the input of the "S" counter. Whenever $CL_{IN}$ makes a transition from "high" to "low" an input (advance or count) signal is applied to the first stage of the S counter.

The operation of the system will now be described with the aid of FIG. 4 for the condition when a read-the-contents-of the counters-command is initiated within a period T1, selected in this design to be 250 milliseconds, prior to the time ($t_{10}$) an input signal (i.e. when f2 makes a high to low transition) is normally to be applied to the S counter.

Recall that whenever any one of addresses A1 through A6 is high, a read-out of the counter contents has been requested. Accordingly, when any one of the address signals (A1 through A6) is present (high) the output E1 of OR gate 81 goes high. E1 and clock signals f1 and f2 are applied to the three inputs of AND gate 83. The "AND'ing" of the f1 and f2 clock signals generates a controlled period, also referred to as a "settable" period, having a width of 250 milliseconds before the generation of each input signal [i.e. the negative going transition of the f2 clock signal]. Thus, any positive going address signal occurring during the "settable" period (the period when both $f_1$ and $f_2$ are high) causes E1 and the output (E2) of AND gate 83 to go high. When E2 goes high flip-flop 85 is set such that its Q output is driven high.

Figure 4:
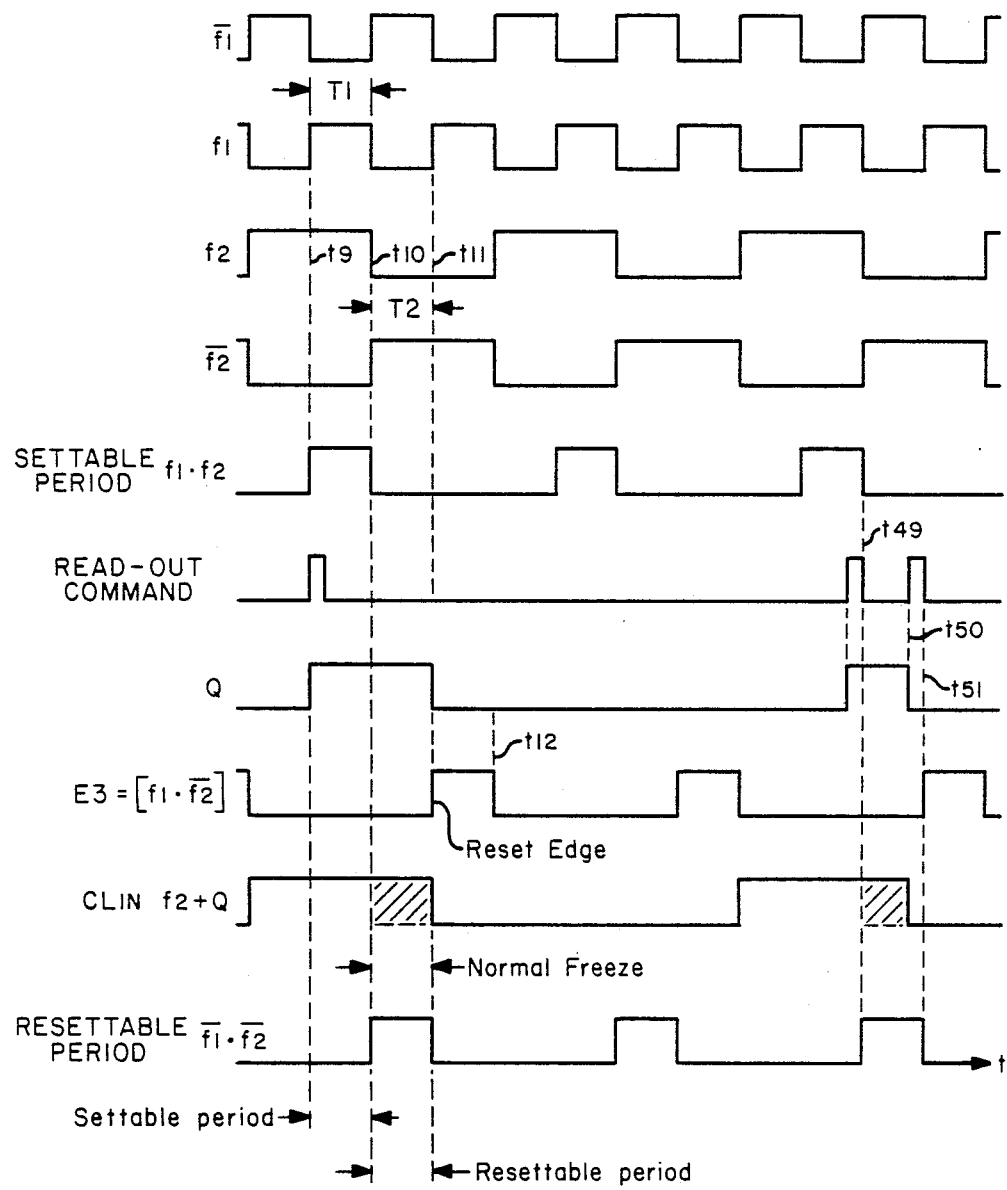
FIG. 4 is a drawing of waveforms associated with the system of FIG. 3.

Once the Q output of flip-flop 85 is set high, it remains high (and the $\overline{Q}$ output remains low) until a positive RESET signal is applied to the flip-flop 85, as shown for waveform Q in FIG. 4, where, for example, Q is high from $t_9$ until $t_{11}$. The application of the high Q signal to one input of two-input OR gate 89, holds its output E5, denoted as $CL_{IN}$, high (i.e. it cannot go low at time $t_{10}$) as long as Q remains high, as shown for waveform $CL_{IN}$ in FIG. 4 from $t_9$ to $t_{11}$. Thus, even after $f_1$ and $f_2$ have returned to their low (0) state, the input signal to counter 60 is "frozen" at the high level, (during the period $t_{10}$–$t_{11}$) i.e. it cannot change and generate an input signal, as long as Q is high.

Flip-flop 85 is reset and Q is driven low when the output (E3) of AND gate 87 goes high. In this design f1 and $\overline{f2}$ are "AND'ed" to produce an unconditional RESET pulse, at the output E3 of AND gate 87, a period T2, selected herein to be 250 milliseconds, after a 1 cps input pulse (i.e. negative transition of f2) normally occurs. As shown for waveform E3 in FIG. 4, the output E3 goes high at time $t_{11}$ unconditionally resetting flip-flop 85 and causing Q to go low. When Q goes low, $CL_{IN}$ also goes low immediately since f2 (the 1 cps signal) is low at that time. Hence, a "delayed" input signal ($CL_{IN}$ transition from high to low) is produced at the end of the "freeze" period causing the "S" counter to be advanced by one count.

Therefore, in response to a read-the-contents of-the-counters-command occurring between time $t_9$ and $t_{10}$ (i.e. during the "settable" period) $CL_{IN}$ will normally be "frozen" in the high state until time $t_{11}$. The "freeze" period is designed to be sufficiently long to permit all the counters to be read-out prior to the application of a "delayed" input pulse. Since $CL_{IN}$ cannot change between time $t_9$ and $t_{11}$, the read-out and/or display of the counter contents will reflect their status as of the preceding count (i.e. the count generated by the negative transition of f2 prior to time $t_{10}$). The maximum error is then a portion of 1 second rather than the unacceptably large errors possible with the prior art circuit. Immediately after the freeze period the counters are updated by the generation of the "delayed" input pulse. Thus, no count is lost.

It should be evident that the "settable" period, (i.e. $t_9$ to $t_{10}$) could be widened or narrowed by appropriate choice of clock signals generated within, or derived from, the oscillator. Similarly, it should be evident that the "freeze" period (i.e. $t_{10}$ to $t_{11}$) could be narrowed by "ANDing" a higher frequency clock signal with f2 and f1 (or $\overline{f2}$ and $\overline{f1}$) or that the freeze period could be widened by appropriate choice of oscillator signals, the criterion for setting the length of the freeze period being the amount of time necessary to read-out the contents of the counters by a microprocessor or other suitable display device. Thus, clock signals other than the 2 cps and 1 cps clocks could be used to generate the lengths of the desired periods.

Other features of the invention are now discussed. Since the microprocessor read command function is asynchronous with respect to the real time clock (oscillator 10a and counting chain 12a) it is possible for more than one read command to occur within a 250 millisecond interval. Therefore, more than one read command may be generated during a "settable" period or during a "freeze" period, although the minimum interval between successive read commands is sufficiently long to enable the read-out of all the counter sections in response to a read command before the next is generated. Successive read commands generated during the same "settable" period do not alter the status of control circuit 80 or of the clock input ($CL_{IN}$) to the counter chain since Q remains high and no reset can be generated. Hence, the same counter data is read-out during successive reads occurring within the same "settable" period.

It has been shown that if a read command occurs just before the negative transition of f2, flip-flop 85 is set (Q goes high) and the clock transition (i.e. the input signal) is delayed, as discussed above. It remains to be shown that the system of FIG. 3 prevents the read-out of erroneous data if a read command occurs immediately after a negative transition of $CL_{IN}$.

In systems embodying the invention, the dummy address, ADD 6, is generated prior to the generation of any other address (i.e. ADD 1 through ADD 5). ADD 6 does not cause the read-out of any counter. Since ADD 6 precedes the other addresses, any timing and overflow signal rippling through the counters when ADD 6 is first generated will have completely rippled through when any of ADD 1 through ADD 5 are subsequently generated to read-out the contents of their respective counters. By way of example, it takes 1 microsecond for an input signal to ripple through the counting chain (i.e. from the first stage of the first counter through the last stage of the last counter) while the time between successive addresses is 3 microseconds. Thus, the generation and use of dummy address ADD 6 enables the counters to have reached a steady state condition when their contents are to be read-out immediately after either the occurrence of a regularly occurring (1 cps) input pulse or of a "delayed" input pulse.

The system of FIG. 3 also enables error free read-out of the data during the freeze period by means of "AND'ing" ADD 6 with the $\overline{f1}$ and $\overline{f2}$ clock signals as discussed below. Due to the asynchronous nature of the system, it is possible for a read command to be generated during a freeze period. The combination of $\overline{f1}$ and $\overline{f2}$ is used to generate a period of time T2 (e.g. time $t_{10}$ to $t_{11}$), also denoted as a "resettable" period, following the occurrence of the normally occurring f2 input pulse, to enable a read out during the freeze period. The combination of ADD 6 with the $\overline{f1}$ and $\overline{f2}$ signals in AND gate 88 ensures that a new read command occurring at any time during the freeze period shortens the freeze or delay period as shown for time $t_{50}$ in FIG. 4. The generation of an ADD 6 (e.g. at time $t_{50}$) indicative of a new read command during a resettable period (e.g. between time $t_{49}$ and $t_{51}$) causes the output of AND gate 88 to go high and flip flop 85 to be RESET driving Q low and causing a negative $CL_{IN}$ transition as shown for time $t_{50}$. The clock transition updates the count in the counter chain at the time ADD 6 is first produced. Since the occurrence of ADD 6 precedes any other addresses, the clock transition occurs before any counters have to be read. As noted above, the counters will have reached a steady state condition when eventually addressed by ADD 1 through ADD 5 and a valid updated count will be read out of the counters. Thus, the generation of the "early" dummy address (ADD 6) is significant in reducing the possibility of an erroneous read-out of the counter contents.

Once the freeze or delay period has been terminated, any subsequent read command occurring before the next 1 cps clock transition will read the updated information present in the counters.

Figure 3:
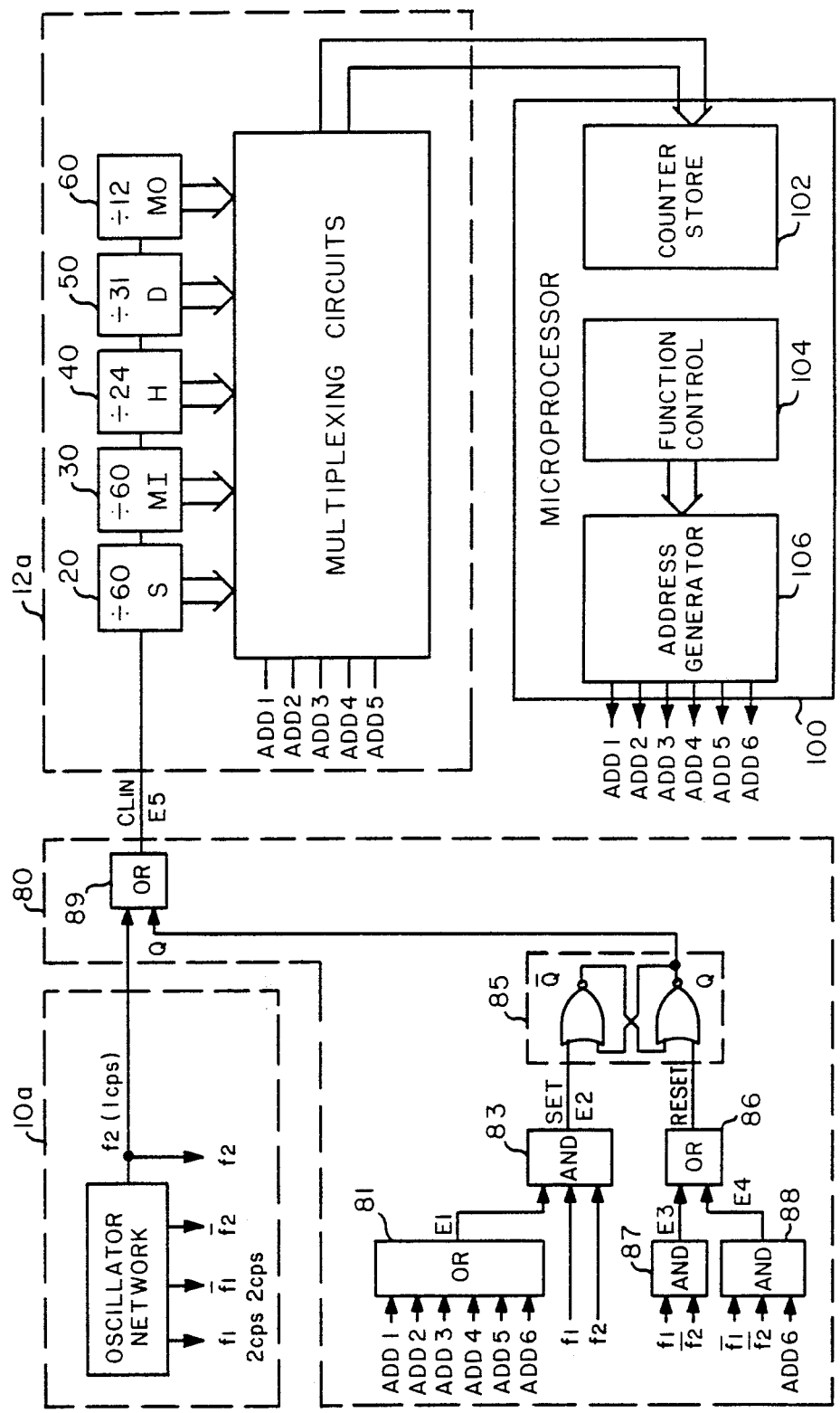
FIG. 3 is a schematic diagram of a timing system embodying the invention.

The counting chains in FIGS. 1 and 3 include counters connected in series where the overflow of one counter (except for the last) is used as the input to a succeeding counter. However, the invention is also applicable where a plurality of counters are operated in parallel from a single clock source where the counters are read at different times.

In the circuit of FIG. 3 regularly occurring pulses (1 cps) are applied to the input of the first counter via OR gate 89. However, the inventive concept is also applicable when the input pulse is not a regularly occurring pulse. In such an instance, a signal, such as ADD 6, responsive to a read command may be used to trigger a monostable multivibrator (or a like circuit) to inhibit and delay the application of an input signal to the counter chain until after the interval to which the multivibrator is set.

In FIG. 3 the desired logic functions have been shown using descriptive blocks. It should be evident that any combination of suitable logic circuits may be used to form the equivalent functions.

What is claimed is:

1. A timing system comprising:
    a plurality of counters, each counter having a toggle input to which is applied a counting pulse and having an output;
    read-out means coupled to said counters responsive to a read-out command for selectively reading-out their contents;
    a source of regularly occurring input pulses; and
    control means coupling said source of regularly occuring input pulses to the toggle input of at least one of said plurality of counters for normally applying said input pulses with little, if any, delay to the input of said at least one of said plurality of counters, said control means including means for generating a timing signal for a period of time T1 prior to each occurrence of said regularly occurring input pulses, said control means being responsive to said timing signal and to the occurrence of a read-out command within said given time period, T1, for delaying the application of said input pulse for a period of time T2 which is sufficiently long to enable the read-out of said plurality of counters one at a time, and said control means including means for applying a delayed input signal to the toggle input of said at least one of said plurality of counters following said period of time T2.

2. The combination as claimed in claim 1 wherein said plurality of counters are connected in series, with the output of each counter, except for the last, being connected to the toggle input of the succeeding counter; and with the first counter of the series chain containing the least significant bits.

3. The combination as claimed in claim 2 wherein said source of input pulses is an oscillator producing regularly occurring clock signals to be counted by said counters.

4. The combination as claimed in claim 3 wherein said control means includes a first means having an input connected to said source of input pulses and having an output connected to the toggle input of the least significant bit counter of said plurality of counters for normally passing said regularly occurring clock signals from said oscillator to said toggle input of the first counter and for in response to the occurrence of a read-command normally freezing the level at the output of said first means until the termination of said period of time T2.

5. The combination as claimed in claim 4 further including means coupled to said first means responsive to the occurrence of a read command during said time T2 for terminating the freezing of the level at the output of said first means and causing a change in level at the output of said first means in response to the occurrence of a read command.

6. In combination with a real time clock comprised of an oscillator producing regularly occurring timing signals applied to a count down chain and including reading means coupled to the count down chain producing read signals for selectively reading the contents of the count down chain in sections and asynchronously with respect to said timing signals whereby an erroneous read-out of the contents of the count down chain can occurr as a result of a timing signal being generated during a read-out of the contents of the count down chain, the improvement comprising:
    control means coupled between said oscillator and said count down chain normally coupling said regularly occurring timing signals to said count down chain with substantially no delay, and
    said control means including means responsive to signals from said oscillator for producing a time slot a given time T1 before the occurrence of each one of said regularly occurring timing signals and said control means being responsive to the occurrence of said read signal during said time slot for delaying the application of said regularly occurring timing signal to the count down chain for a second period of time T2 which is sufficiently long to enable the read-out of all the sections of said count down chain.

7. The improvement as claimed in claim 6 wherein said reading means includes means for producing first and second types of read signals, said first type of read signals preceding the generation of said second type and said first type being applied solely to said control means for indicating the occurrence of a read signal and initiating a delay in the application of said regularly occurring timing signal, and said second type of read signal being coupled to said control means and to said count down chain for causing a read-out of its contents.

8. The improvement as claimed in claim 7 wherein said read means is a microprocessor.

* * * * *